US008742968B2

(12) United States Patent
Quiquempoix

(10) Patent No.: US 8,742,968 B2
(45) Date of Patent: Jun. 3, 2014

(54) ANALOG FRONT END DEVICE WITH TWO-WIRE INTERFACE

(71) Applicant: Microchip Technology Incorporated, Chandler, AZ (US)

(72) Inventor: Vincent Quiquempoix, Divonne les Bains (FR)

(73) Assignee: Microchip Technology Incorporated, Chandler, AZ (US)

( * ) Notice: Subject to any disclaimer, the term of this patent is extended or adjusted under 35 U.S.C. 154(b) by 21 days.

(21) Appl. No.: 13/671,903

(22) Filed: Nov. 8, 2012

(65) Prior Publication Data

US 2013/0120032 A1    May 16, 2013

Related U.S. Application Data

(60) Provisional application No. 61/558,536, filed on Nov. 11, 2011.

(51) Int. Cl.
*H03M 1/10*    (2006.01)
*G06F 13/42*   (2006.01)

(52) U.S. Cl.
CPC ............. *H03M 1/10* (2013.01); *G06F 13/4282* (2013.01)
USPC ................................ 341/155; 710/14; 710/69

(58) Field of Classification Search
USPC ................. 341/110, 126, 155; 710/10–14, 69
See application file for complete search history.

(56) References Cited

U.S. PATENT DOCUMENTS

| 5,796,361 | A   |   | 8/1998  | Levinson ................ 341/172 |
|-----------|-----|---|---------|----------------------------------|
| 6,427,129 | B1  | * | 7/2002  | Lalla ........................ 702/88 |
| 6,642,879 | B2  | * | 11/2003 | Amar et al. ............... 341/155 |
| 6,681,332 | B1  | * | 1/2004  | Byrne et al. ............... 713/300 |
| 6,831,583 | B1  | * | 12/2004 | O'Dowd et al. ........... 341/155 |
| 7,533,106 | B2  | * | 5/2009  | Magdeburger et al. ........ 1/1 |
| 7,633,420 | B2  | * | 12/2009 | DuPuis ..................... 341/143 |

FOREIGN PATENT DOCUMENTS

WO    01/63770 A1    8/2001    .......... H03M 3/00

OTHER PUBLICATIONS

International Search Report and Written Opinion, Application No. PCT/US2012/064432, 8 pages, Apr. 19, 2013.

* cited by examiner

*Primary Examiner* — Howard Williams
(74) *Attorney, Agent, or Firm* — King & Spalding L.L.P.

(57) ABSTRACT

An analog front end (AFE) device has at least one programmable analog-to-digital converter (ADC) and a serial interface switchable to operate in a bidirectional serial interface mode and in a unidirectional two wire serial interface mode, wherein the unidirectional two wire serial interface mode only uses a clock input and a data output signal line, wherein the ADC operates in the unidirectional two wire serial interface mode synchronous with a clock supplied to the clock input.

34 Claims, 10 Drawing Sheets

ANALOG FRONT END DEVICE WITH TWO-WIRE INTERFACE

CROSS-REFERENCE TO RELATED APPLICATIONS

This application claims the benefit of U.S. Provisional Application No. 61/558,536 filed on Nov. 11, 2011, entitled "ANALOG FRONT END DEVICE WITH TWO-WIRE INTERFACE, which is incorporated herein in its entirety.

TECHNICAL FIELD

The present disclosure relates to analog front end devices.

BACKGROUND

There exists a need of poly-phase shunt power/energy metering front end devices for smart metering respecting the need to reduce the isolators cost and the costs induced by handling separate front-ends for isolated and non-isolated separate devices.

SUMMARY

According to various embodiments an analog front end (AFE) device may comprise at least one programmable analog-to-digital converter (ADC) and a serial interface switchable to operate in a bidirectional serial interface mode and in a unidirectional two wire serial interface mode, wherein the unidirectional two wire serial interface mode only uses a clock input and a data output signal line, wherein the ADC operates in the unidirectional two wire serial interface mode synchronous with a clock supplied to the clock input.

According to a further embodiment, when the serial interface is configured in the unidirectional two wire serial interface mode a data output at the data output signal line can be frame based. According to a further embodiment, the ADC may comprise at least one of internal voltage reference, internal clock generation, and internal gain amplifier. According to a further embodiment, the AFE device may further comprise a PLL for generating an internal clock signal which is faster than a clock signal provided on said two-wire serial interface. According to a further embodiment, the programmable ADC can be a sigma-delta converter driven by the clock signal provided by the two-wire serial interface. According to a further embodiment, the AFE device can be designed to automatically reset when a clock signal at said clock input is kept for a certain time at a defined logic level or floating. According to a further embodiment, the AFE can be arranged within a housing comprising external pins and wherein some of the external pins are configured to program the operating mode and the ADC by respective signals applied to some of the external pins. According to a further embodiment, the signals can be selected from a power supply and ground or any other fixed DC voltage level, or by a floating node detector. According to a further embodiment, an oversampling rate can be programmed by at least one of said external pins. According to a further embodiment, a pin can be provided for programming the operating mode of said serial interface. According to a further embodiment, a gain can be programmed by at least one of said pins. According to a further embodiment, two pins can be provided for programming the gain. According to a further embodiment, a frame may comprise a frame register value and frame data and wherein a frame is transmitted through said serial interface after a data ready signal is generated by said ADC. According to a further embodiment, the frame may comprise parameter settings of said AFE device. According to a further embodiment, the frame can be repeated n times between consecutive data ready signals. According to a further embodiment, each of the frames may incorporate a frame count to be recognized from another one. According to a further embodiment, the frame may contain checksum and/or CRC checksum so that integrity of the data transmission can be verified and guaranteed. According to a further embodiment, the checksum and/or CRC checksum can be placed at the end of the frame. According to a further embodiment, the AFE device may comprise a plurality of multiple function pins and one external pin may be configured to set an operation mode of the device, wherein in a first mode, the device operates with the two-wire serial interface and uses external pins for programming said AFE device and in a second mode the device operates with a standard input/output serial digital interface for programming said AFE device. According to a further embodiment, in an initialization phase the AFE device may use a 1-wire protocol or a UART interface to program the part and then the part returns automatically into the 2-wire mode.

According to another embodiment, a method of operating an analog front end (AFE) device comprising an analog-to-digital converter and serial interface switchable between a first and a second operating mode, may comprise the steps: Selecting said first or said second operating mode by means of an external pin, wherein in said first operating mode, the serial interface operates in a bidirectional serial interface mode and in said second operating mode in a unidirectional two wire serial interface mode, wherein the unidirectional two wire serial interface mode only uses a clock input and a data output signal line; Programming the analog-to-digital converter (ADC) by means of external pins; and Transmitting digital values acquired by the ADC through the serial interface, wherein when said second operating mode is selected, the ADC operates synchronous with a clock supplied to the clock input.

According to a further embodiment of the method, the method may further comprise, when said second operating mode is selected, outputting frame based data at the data output signal line. According to a further embodiment of the method, a frame may comprise a frame register value followed by said ADC digital values. According to a further embodiment of the method, the AFE device may comprise a gain amplifier and the method further comprises programming the gain amplifier by means of external pins when said second operating mode is selected. According to a further embodiment of the method, the frame may comprise parameter settings of said AFE device. According to a further embodiment of the method, a number of frames can be output during consecutive data ready signals of the ADC.

According to yet another embodiment, a method for operating an analog front end device in a first and second operating mode, wherein the analog front end device comprises a programmable analog-to-digital converter (ADC); a programmable gain amplifier, and a serial interface arranged in a housing with a plurality of multi-function pins, the method comprising: providing one external pin to select the first or second operating mode; wherein in the first operating mode, the multi-function pins are controlled to provide a bidirectional serial interface for said AFE device, and wherein in the second operating mode, the multi-function pins are controlled to provide a reduced pin unidirectional serial interface and programmability of the AFE device through at least one of said multi-function pin.

According to a further embodiment of the above method, when in said second mode, said serial interface may operate as unidirectional serial interface which receives a clock signal and outputs a frame comprising a frame register value followed by digital values acquired by the ADC, and wherein the received clock signal is used to operate said ADC. According to a further embodiment of the above method, a number of frames can be output during consecutive data ready signals of the ADC. According to a further embodiment of the above method, the frame may comprise parameter settings of said AFE device.

According to yet another embodiment, a system may comprise a plurality of AFE devices as described above and further comprise a microcontroller unit, a digital isolation device for each AFE, wherein a digital isolation device includes one set of bidirectional digital isolation units for transmitting a data signal from the AFE and receiving a clock signal from the microcontroller unit, wherein the microcontroller comprises separate serial inputs for each AFE.

According to a further embodiment of the above system, a single clock output of the microcontroller may be coupled through said digital isolation devices with each AFE. According to a further embodiment of the above system, the microcontroller may comprise dedicated clock outputs for each AFE. According to a further embodiment of the above system, each digital isolation device may comprise a chip select input on a microcontroller connected side of the digital isolation device, wherein the chip select inputs are coupled with respective port outputs of the microcontroller.

DETAILED DESCRIPTION

According to various embodiments, an analog front end device allows to handle isolated applications with almost no cost difference for the analog front end. The various embodiments can reduce the cost of digital isolated poly-phase systems by reducing the number of communication channels to 2 unidirectional channels (one for clock one for data output).

Dual mode metering analog front-end for both isolated and non-isolated metering applications according to various embodiments permit to use the same circuit to be used in isolated and non-isolated metering applications and offer a dedicated mode and serial interface communication for isolated applications.

Figure 1:
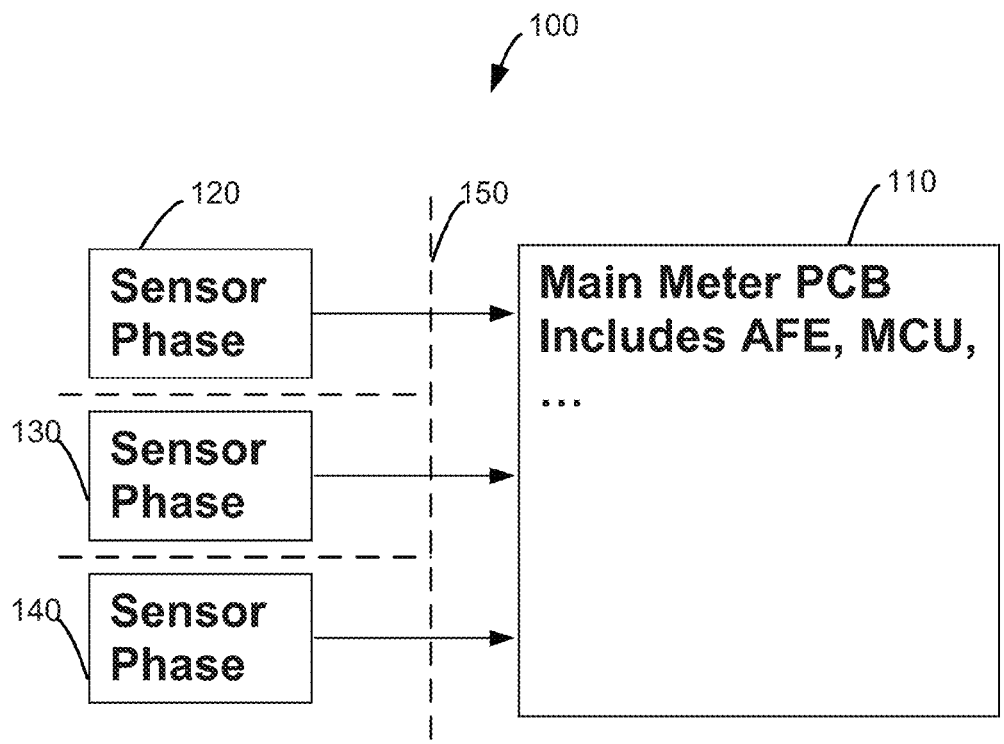
FIG. 1 shows a conventional system with isolated sensors.

The energy/power metering analog front-ends require isolation from the line voltage (110V or 220V). Other applications may also require such kind of isolation when measuring a voltage or current coming from a different voltage supply domain. This isolation problem is often solved by using isolated sensors 120, 130 140 like current transformers or Rogowski coils coupled with a main meter printed circuit board 110 as shown in FIG. 1. Reference symbol 150 shows the isolation barrier in such a system 100. Thus, FIG. 1 shows isolated sensors 120, 130, 140 in combination with a metering device 110. Phases are isolated through the sensors. This can be accomplished with current transformers which are very prevalent though expensive and have phase and tampering issues, with Rogowski coils which are less expensive, very linear but have high harmonics issues, or for example with Hall effect sensors, which need an ASIC, and have lots of mechanical and EMI issues.

These sensors 120, 130, 140 isolate the metering device (analog front-end) 110 from the line voltage and have a voltage or current output that can be sensed by such devices. However, as mentioned above, these sensors are often expensive or require a lot of back end processing to overcome some non-linearity or accuracy issues. The most popular current sensor for power metering is a simple shunt resistor (often very small values in the 100 micro-ohms range) because of its cost, linearity, size, availability. The problem with the shunt resistor is that there is no isolation on this device. For 1-phase power metering, the main board where the analog front-end resides can be referenced to the line voltage to avoid the isolation need. However this is not true for poly-phase metering, where each phase needs to be isolated from each other and where all analog front-ends residing on each phase need to communicate metering information between themselves or to a main processor or microcontroller unit (MCU). In this case, a system 200 comprises a metering analog front end 215, 235, 255 coupled with respective sensors 210, 230, 250 which reside on each isolated phase. This front-end 215, 235, 255 communicates with other phases or the main processor or MCU 110 with digital communication lines through a number of digital isolators 220, 225; 240, 245; and 260, 265 as shown in FIG. 2.

Figure 2:
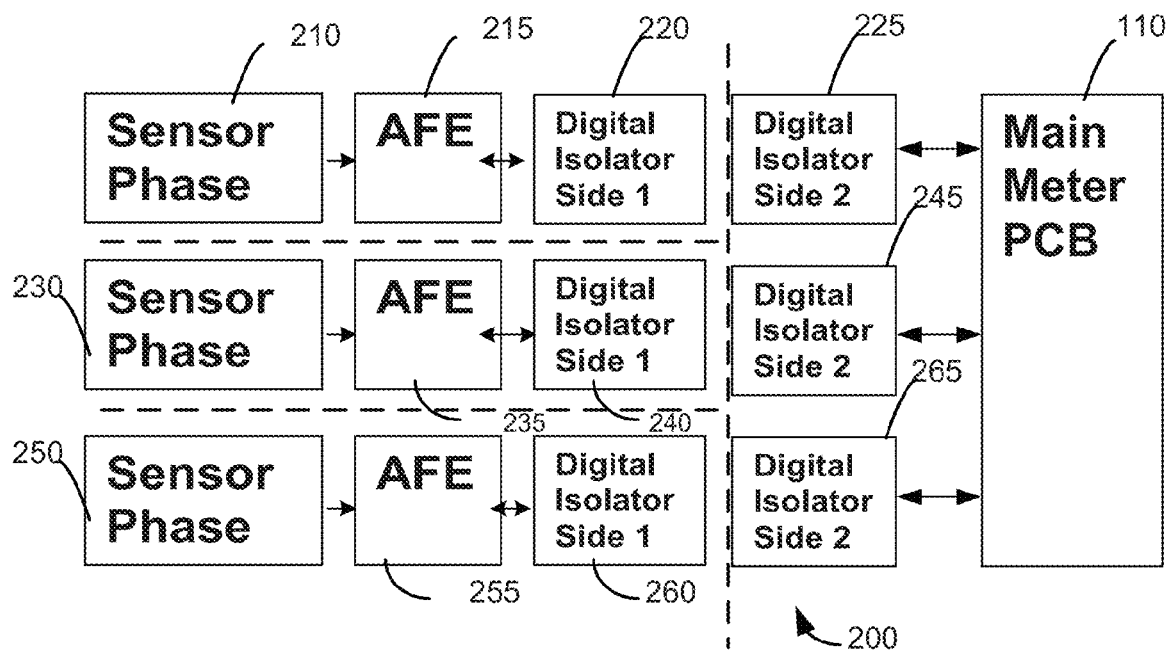
FIG. 2 shows a conventional system with non-isolated sensors.

FIG. 2 shows non-isolated sensors 210, 230, 350 in combination with a metering device 110. Phases are isolated for each sensor through digital isolators 220, 235; 240, 245, and 260, 265 that must be configured to allow full support of the respective digital interface between the AFE and the main processor 110. Hence, if an SPI interface is used, four separate digital isolators are necessary. The sensors may be shunts which are very low cost, very linear, have no phase issues, and the only issue is power consumption and isolation. However, as shown each sensor requires an associated analog front end device 215, 235, and 255, and digital isolator supporting the respective AFE digital interface.

For the non-isolated applications (where sensors are already isolated), the analog front-ends often use a standard 2/3/4 wire communication protocol to communicate to the MCU. This serial interface may be implemented according to, for example the I²C or SPI or UART protocols. This standard interface offers nice flexibility and data rate. However when it comes to isolated applications like poly-phase shunt metering applications, there is a need for the analog front end to simplify as much as possible the communication protocol in order to diminish to the maximum the number of digital isolators that are needed for communication. A minimum number of isolators are required for low cost solutions and therefore a specific interface needs to be developed to address this need but still guarantee enough flexibility, security, data rate to operate correctly. According to various embodiments, the smallest number of uni-directional isolators, if synchronization between phases needs to be guaranteed, can be two per phase. In addition clock signals must be provided for robust and secure data transmission protocols such as SP[1] and I[2]C or uART.

According to various embodiments, a protocol and interface is described that can work either as a standard SPI interface or as a 2-wire (2 unidirectional wires) dedicated for poly-phase applications. The 2-wire interface includes a clock input and a data output. The clock and data are synchronous. The clock is used for both the master clock of the analog front end and the serial communication interface to synchronize the data outputs. This clock can be shared for poly-phase applications, ensuring the proper synchronization between all phases and thus guaranteeing the proper angle between all phases at all times. According to various embodiments, the data output can be in frame format, wherein each frame appears at a certain period equal to a certain number of master clock cycles. The framed data contains a synchronization word (this can be more or less than a byte, 1-bit signal or multi-bit serial frame), a byte that contains the configuration of the front end (again this can be I-bit or multi-bit serial frame instead of just a byte) and additional bytes for the output data generated by the analog front end (for example 3 bytes per ADC in a dual ADC analog front-end). The output data is refreshed at a fixed data rate and the serial data output pin sends a frame that is synchronous with the data generated by the analog front end which is also synchronous with the master clock received by the analog front end. The number of isolators used in this solution is two (one for clock input and one for data output), but the number of communication channels is one (it is equivalent to one bidirectional wire). The number of pins required for this interface is two because most of the time, the digital isolators have unidirectional channels for data transmissions.

According to various embodiments, the synchronization word can be placed at the beginning of the data communication in order to be able to use this as an interrupt trigger and as a recognition pattern for the master microcontroller unit (MCU). The MCU can recognize this word (or sequence of bits) and enable the retrieval of data once recognized. This word can also serve as a check for the synchronization between the multiple phases in an application. According to an embodiment, if the number of clocks is constant between two transmissions, this sync pattern permits to understand, detect and correct any synchronization issue that may have come because of a loss of transmission (that is more frequent than regular applications due to the nature of the digital isolation).

A loss of synchronization can be recuperated by software post processing in the MCU or can also be recuperated if the master clock is generated independently on each phase. In this case, the master clock would be normally generated synchronously for each phase and in the case of a bad communication in one of the phases, the user could re-adjust the master clock of this phase by sending more or less clocks than on the other phases. This technique requires additional pins and PWM generators on the MCU. The post processing for resynchronization requires only an interpolator and can be done in firmware with no necessary additional pins. Another simpler technique for handling loss of synchronization is to fully reset the analog front end through a watchdog timer when a loss or misalignment is detected. This technique implies a larger delay for the realignment because the analog front end has to be reinitialized with all the power up timings or settling times associated with the full reset.

According to various embodiments, the standard interface and the dedicated 2-wire unidirectional interfaces can be combined in a unique chip so that both poly-phase and single phase applications can be utilized with no restrictions on the flexibility on the single phase applications, while guaranteeing enough flexibility on the poly-phase to satisfy the needs of the majority of the applications and minimize the need of single unidirectional digital isolated channels down to two for each phase.

The 2 unidirectional wires interface can take advantage and be shared with the clock and data I/Os of the regular serial interface existing in the analog front-end. It does not require additional pins to be implemented. It just needs a selection pin or procedure to be able to switch between the two protocols. According to further embodiments, a way will be described below to realize this switching with no additional pin, reusing an existing pin to perform this switch.

In the analog front end according to an embodiment, if the device has a crystal oscillator, two pins are necessary for this function. An external clock can be selected by the regular digital interface (like SPI, uART or I2C), which bypasses the crystal oscillator (and puts it in a shut-down mode), and selects one of the pins of the crystal oscillator (OSC1) as the digital master clock input. The other pin (OSC2) is not used in the external clock mode. In this case, this pin can be utilized to select the interface type (standard or 2 wire unidirectional) with a hard logic connection. This selection can be done at power-up if the default mode of the crystal oscillator is shut down mode. In the case of the 2 wire unidirectional mode, the crystal oscillator is always disabled and the master clock is provided by the clock input of the interface. This is required to ensure the proper synchronization and phase angle between the phases without any additional pin required (if a crystal per phase was used, there would have been no synchronization between each phase due to the difference of frequency and phase of each master clock generated by each crystal).

This selection can thus be done depending on the application and other methods of selection can be utilized such as for example but not restricted to:
  additional logic input pin,
  latching a state of a logic pin at power up,
  reading a bit in a memory,
  have an initialization phase with a small state machine that is using the standard interface and switches automatically to the 2-wire interface at the end of this phase, etc.
  . . . .

Since the only input is the master clock input that comes from the Master CPU or MCU, according to an embodiment, the analog front end device must be able to be configured without communicating with the MCU for the dedicated 2-wire unidirectional mode. In this event, according to various embodiments, three possible ways are envisaged: 1) reading an internal or external memory at the boot of the device (like for example an auto-boot on an external EEPROM); 2) reconfigure existing digital pins in the 2-wire mode as hard logic input pins to provide different possible configurations and enable the desired flexibility; 3) use a 1-wire protocol during the initialization phase (for example use the master clock input as the TX pin of a UART interface) and then return to the 2-wire protocol at the end of the initialization. According to one embodiment, all existing digital pins not used when in the 2-wire interface mode are reconfigured to be hard logic inputs to select different configurations in the analog front-end.

The external EEPROM solution could offer much larger flexibility and this with a reduced pin count, but adds a significant cost to the system, often equivalent or superior to the cost of an additional digital isolation channel, which therefore renders its usage not practical (at this point it would be simpler to add a serial data input to the protocol and use the memory of the main MCU type to store the configuration). The present solution of reusing the existing pins is very cost-effective and provides sufficient flexibility to handle most of the applications. The 1 wire protocol (preferably UART) solution is becoming more effective when many configuration bits are needed to program the analog front end. This solution however needs additional internal circuitry to be able to address such a protocol.

Additionally, this new 2-wire interface can be used together with isolators that have an enable function in order to further save pins in the Master MCU. The frame and data at the outputs can be generated multiple times per transmission of a single data, with possibly a frame counter, so that the poly-phase output data can be generated serially and retrieved serially by the master MCU. In this case, the master MCU would select each isolator separately and serially one by one and retrieve the corresponding data and then switch to another phase afterwards. This permits to multiplex the data output of all isolators. Since the master clock needs to be synchronous, only one pin can be used to generate the master clock for all phases. So overall, only two pins plus one enable pin per phase are necessary to process this interface for any number of phases if isolators with enable are used. In this case, the loss of synchronization can be handled by post-processing and interpolation in the MCU.

A standard SPI interface in a device as shown in FIG. 2 would require, for example, 4 digital isolated lines per channel which may be too expensive. The minimum number of isolators per channel is two for a unidirectional interface and comprises clock in and data out. Clock in is necessary because of a requirement of synchronization between all phases. For device manufacturers to be required to have specific parts for non-isolated sensors may be a cost issue (inventory, certification, . . . ). Moreover, non-isolated sensors become more popular (CT cost going higher).

According to various embodiments, an AFE device may be designed that has both a standard SPI interface and a two unidirectional wire interface. According to various embodiments, starting from the SPI interface and simplifying it may solve certain problems as mentioned above: For example, if the device allows fixing all internal settings the SDI pin can be removed as no communication from the master device is necessary. In such an operation mode, the SDO just outputs ADC data periodically every X number of clocks. Hence, for this mode, the data ready pin DR and the chip select CS pins can be removed or otherwise used as no commands are necessary, just a periodical frame output. This offers the possibility of having external pins set to VDD or GND to hardcode settings to change configuration of the device. Therefore, existing digital I/O pins can be reconfigured to be logic inputs in this interface mode. Interface selection can be done with hard logic input.

The digital I/O pins can also be reconfigured to be multi-level logic inputs which levels maybe detected and recognized by an ADC which may be enabled only at power up or in an initialization phase. The multiple levels may be implemented with a resistive divider on each pin or with a floating node detector (which permits to have another state than logic 0 or logic 1). This embodiment would permit to have more configurations per pin.

FIG. 3 shows an embodiment of stand-alone Analog-Front-End device 300 which may operate in one of two modes and can be designed to be pin-to-pin compatible to some extent with, for example, with certain existing Analog-Front-End devices that have a standard 4 wire SPI interface. Depending on the operation mode set by pin MODE, the device operates with a standard SPI interface or a two unidirectional wire interface. The embodiment shown in FIG. 3 has a modified pin layout with multi-function pins. Thus, these pins may have a different functionality depending on the operating mode. For example, the oscillator pin OSC1 also may be used as a clock in pin or a gain setting pin GAIN0. The oscillator pin OSC2 may also be used as a mode pin MODE. The data ready pin DR may be used for gain setting as pin GAIN1. The reset pin may be used as a configuration pin for oversampling OSR0. The SPI interface pin SDI may be used as another configuration pin for oversampling OSR1 and the chip select pin may be used as pin BOOST for setting the boost. The remaining pins may be the same as for a conventional analog front end device. Thus, the multifunction pins are used to define the oversampling rate, gain and boost function of the device when operating in the two unidirectional wire mode.

Figures 3A, 3B:
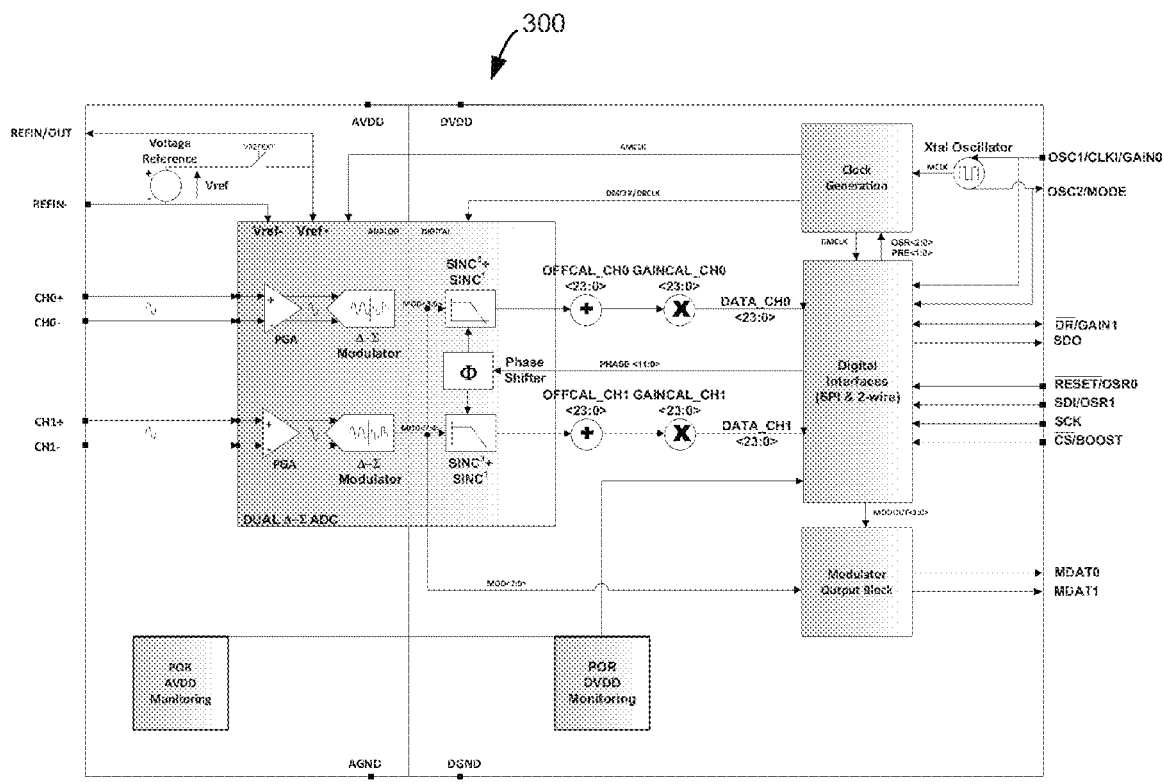
FIGS. 3A, and 3B shows different embodiments of stand-alone Analog-Front-End device.

FIG. 3b shows that other pin layouts are possible to allow for the two different operating modes. According to the embodiment of an analog front-end device 350 shown in FIG. 3B, a user can choose standard SPI or two wire by means of OSC2 pin logic selection which allows the device to operate in two different mode settings. For example, when pin 14 (OSC2) is set to logic "0" then the device operates as a standard front end device with SPI interface. If pin 14 is set to a logic "1" then the device operates similar to the device shown in FIG. 3A. The SPI Interface (SDO/SCK/SDI/CSN) in mode "0" provides a full 4-wire SPI interface including a reset function through pin 1. This mode can be used, for example, for isolated sensors. The two-wire interface (SDO/SCK) in mode "1" needs only one bidirectional digital isolator comprising for example two unidirectional paths. This mode is specifically designed for non-isolated sensor applications like poly-phase shunt meters.

According to the specific embodiment shown in FIG. 3B, the OSC2 pin can be used to detect the interface mode (2 or 4 wire) if an external clock input through only pin 15 is selected, which may be the default mode. Thus, pins 1, 15, 16, 17, 20 have dual functionality depending on the chosen interface according to this embodiment.

Figure 3C:
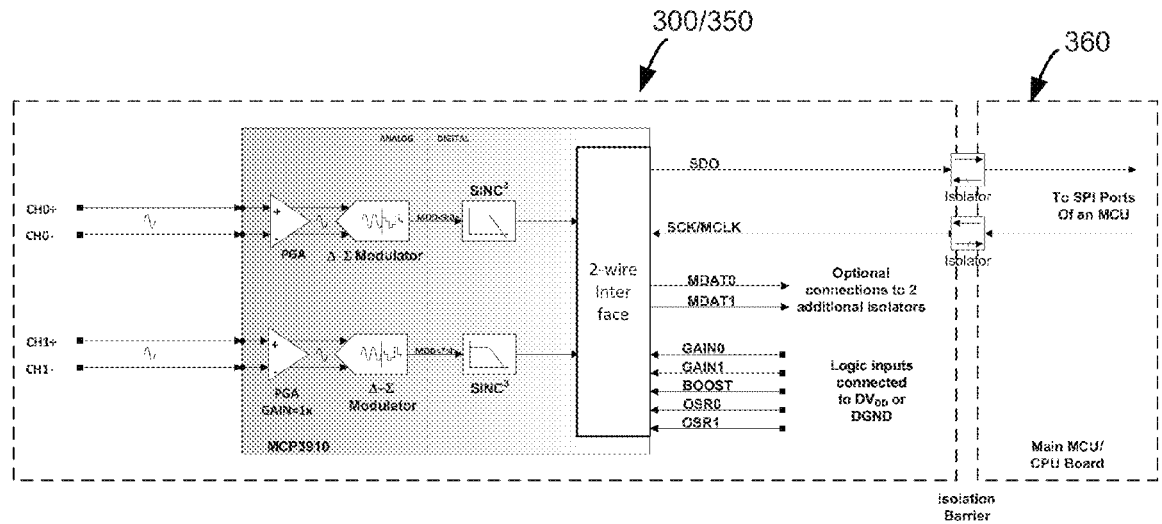
FIG. 3C shows an embodiment according to FIG. 3A or 3B in combination with a microcontroller.

FIG. 3C shows an embodiment of an analog front end device 300/350 as shown in FIG. 3A or 3B coupled with a microcontroller 360 by means of two digital isolators. As can be seen only one line using one driving direction is needed. The SDO transmits from the analog front end device 300/350 to the MCU 360 and the MCU 360 transmits the clock signal to the analog front end device 300/350.

Figure 4A:
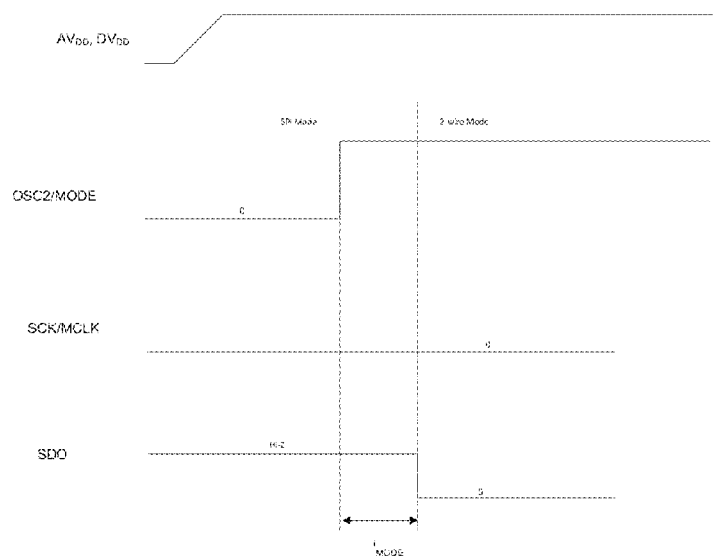
FIGS. 4A and 4B shows timing of various signals of external and internal signals and the two-wire interface according to various embodiments.

FIG. 4A shows certain signals according to an embodiment when the operating mode of an analog front end device is switched from SPI mode to 2 unidirectional wire mode. According to yet another embodiment, the analog front end device can automatically reset when the clock signal is kept for a certain time at a defined logic level or floating. This provides a reset functionality within the 2-wire interface without any necessary additional pin. According to yet another embodiment, when the device is reset by the watchdog timer, for example, if a clock signal stays long enough logic high at the clock input, the part can return to the initialization phase in case there is a power up initialization phase using a 1-wire protocol to program the part. Basically the watchdog timer reset has the same priority as a power on reset, so it may be necessary to reprogram the part which would mean to switch back to an initialization phase in case the reset happens. If the part operates at the beginning in an initialization phase to configure it properly with a 1-wire protocol (like using the TX only of a UART interface), it should be able to return in this first phase if a watchdog timer reset is processed.

Figure 4B:
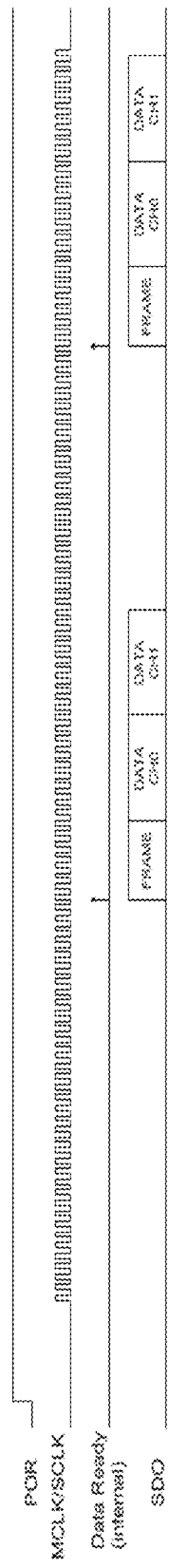

FIG. 4B shows timing of various signals of internal signals and the two-wire interface according to various embodiments. A frame can be made dependent on hard logic inputs (OSR/GAIN/BOOST) settings for higher security (16 bits frame) or fixed (8 bits frame). DATA on each channel here is 24 bits wide. Clocking out all data takes 56 or 64 MCLK periods for 2 channels depending on the frame bit size. Data ready may come every 4xOSR (minimum 256 MCLK periods). This can be extended to higher number of channels and hard logic inputs.

Figure 5:
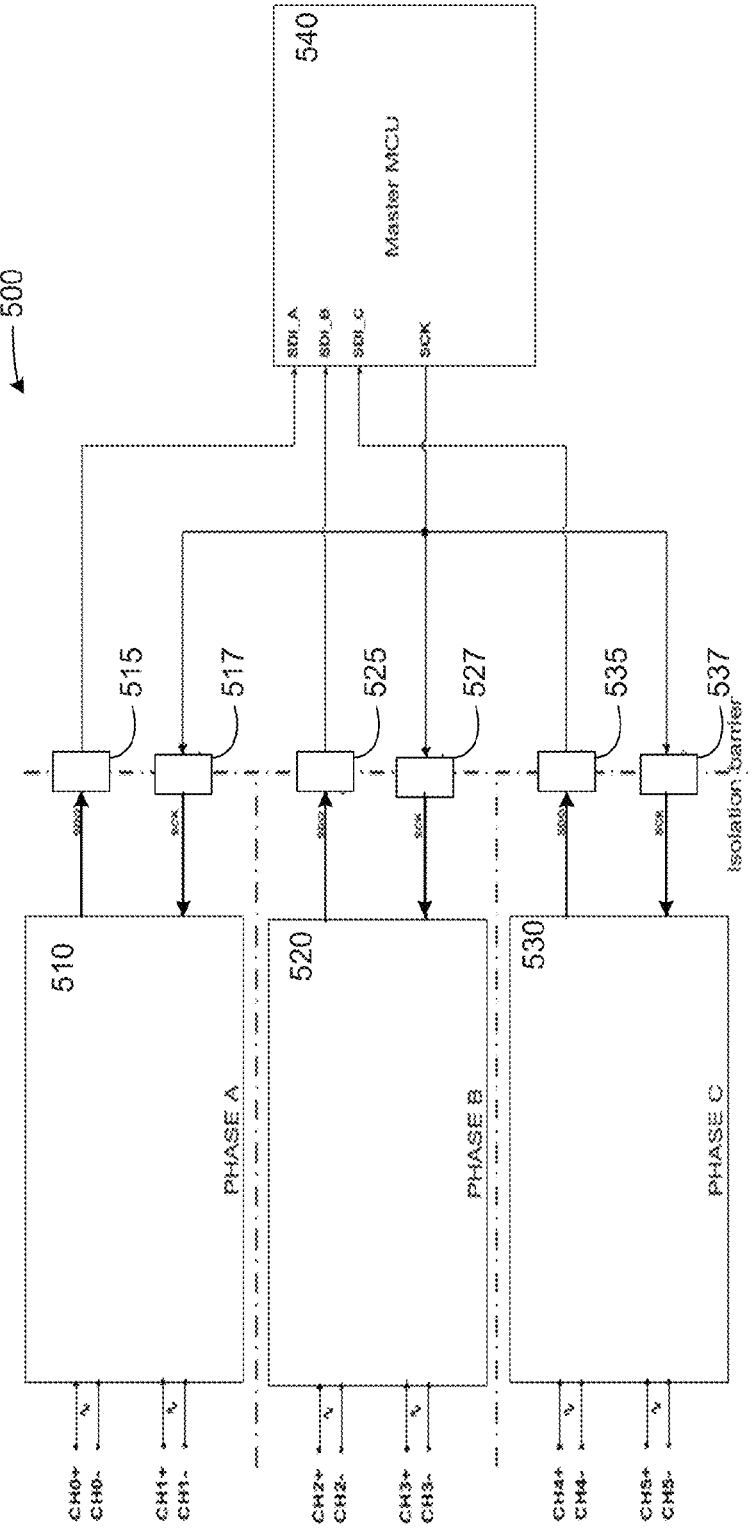
FIGS. 5 and 6 show system arrangements according to various embodiments.
Figure 6:
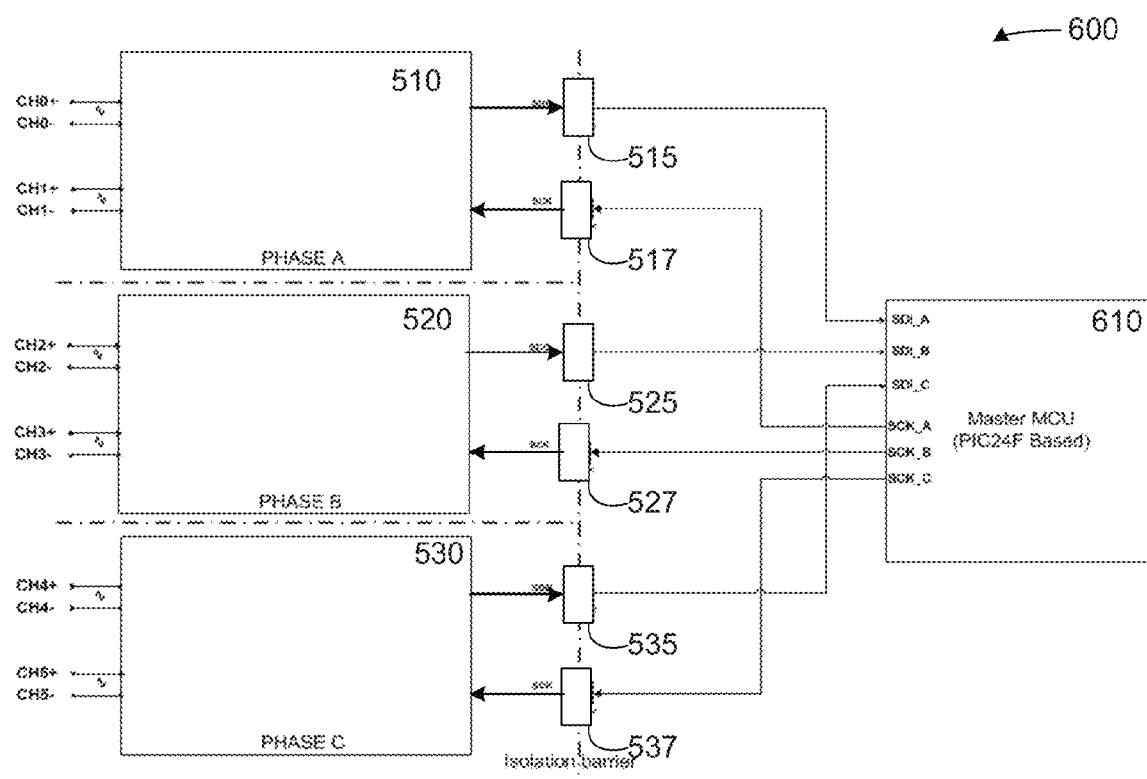

FIG. 5 shows an system 500 with 3 devices according to various embodiments. Three analog front end devices 510, 520, 530 are provided, one for each phase. Only two digital isolators 515, 517; 525, 527, and 535, 537 are necessary, wherein the clock signals are connected to a single clock output of the master MCU 540 and three separate data input pins are provided by the master MCU 540 to connect to the isolated data lines. FIG. 6 shows a system 600, wherein separate clock signals are provided for each 2-wire interface in the associated MCU 610.

Figure 7:
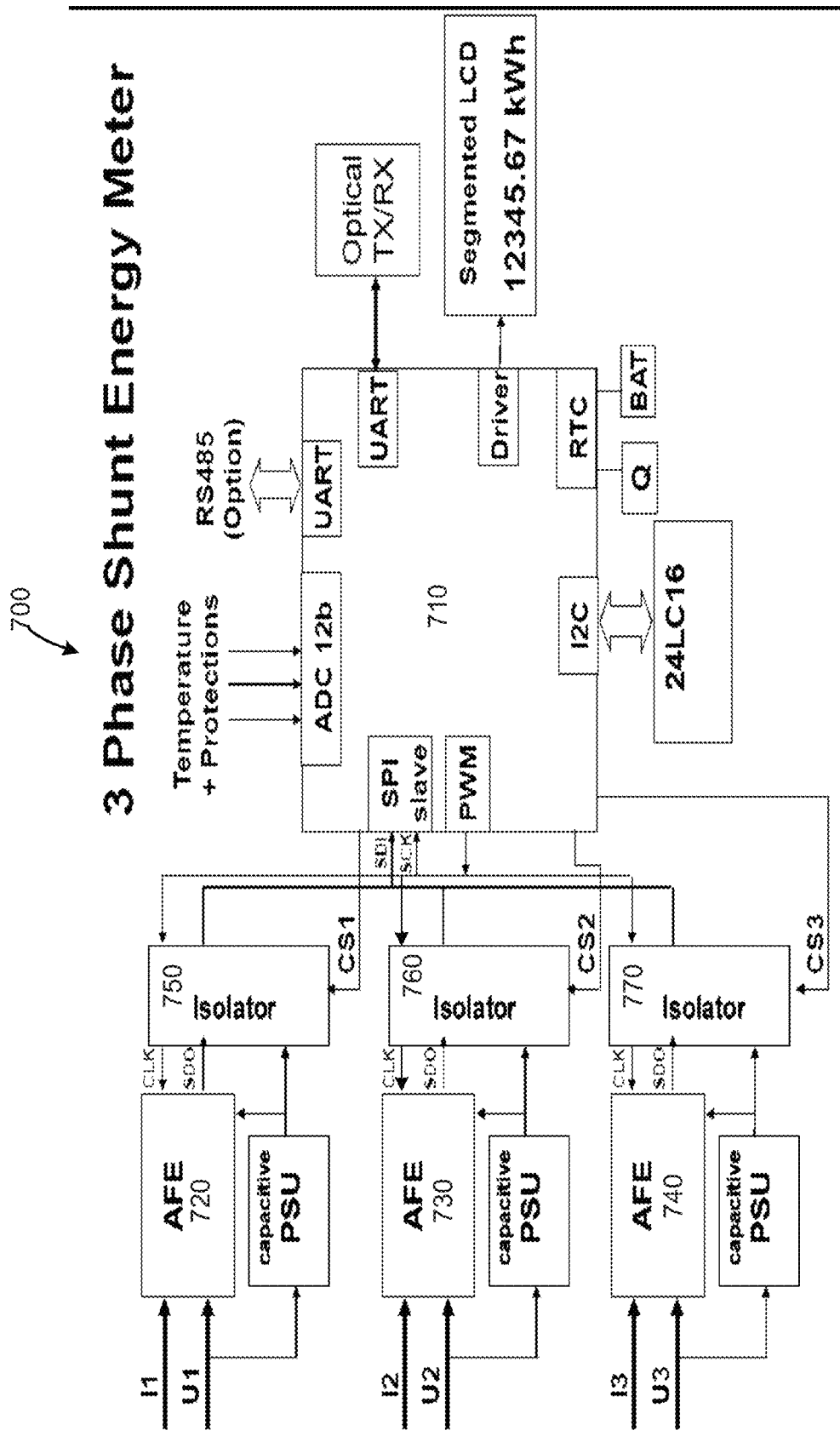
FIG. 7 shows an embodiment of a housing for an Analog Front End device.

FIG. 7 shows again an associated system 700 with a microcontroller 710 using its SPI interface to couple three devices wherein a two-wire interface is implemented in each analog front end device 720, 730, 740. Here, digital two-way isolators 750, 760, and 770 are provided wherein each isolator further comprises a chip-select input that can be controlled by the MCU 710. Other peripheral devices can be implemented in the system, 700 as shown in FIG. 7. FIG. 7 also shows the arrangement of capacitive power supply units for each AFE 720, 730, 740 in each phase.

Figure 8:
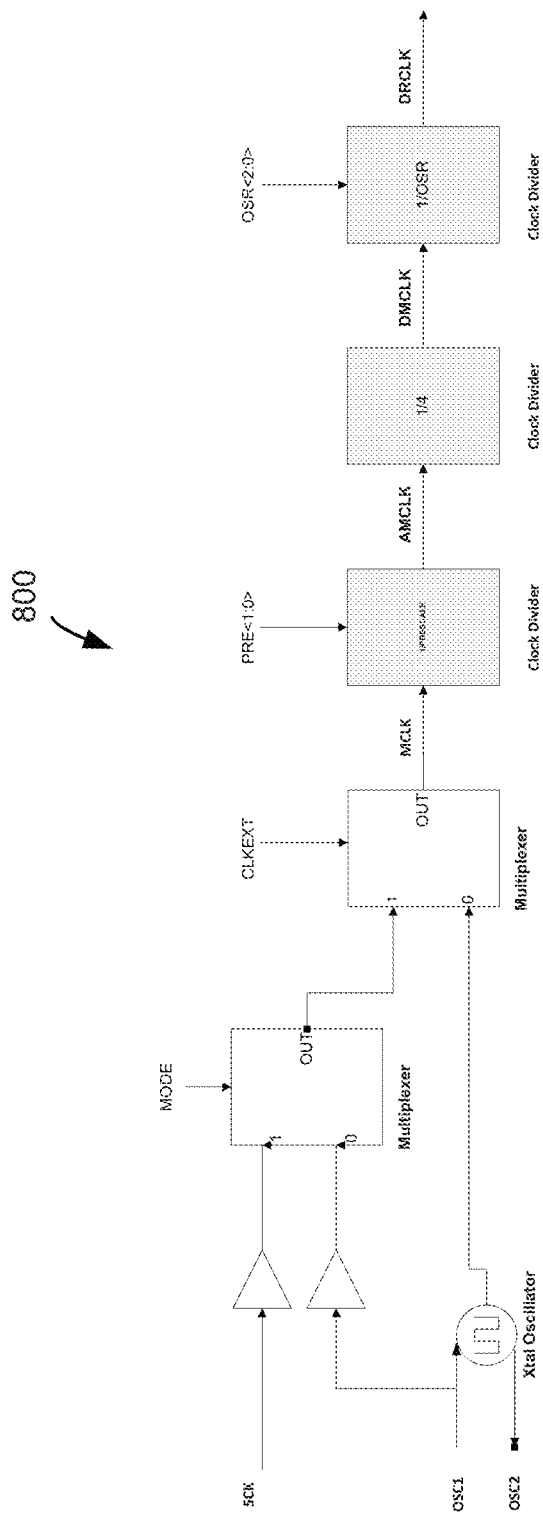
FIG. 8 shows an embodiment of a three wire interface.

FIG. 8 shows an embodiment of an internal circuit 800 capable of decoding the mode setting, for example for a device as shown in FIG. 3A or 3B or any other device that is designed to operate in multiple operating modes wherein one of the oscillator input pins is used for mode selection. To be able to share the full function of the two oscillator pins, the circuit 800 may be designed to use an interface mode selector that decodes a status of pin OSC2 at power up such as a pull up or pull down condition or any other appropriate signal.

In the various applications, the minimum number of connections between the MCU and an AFE device is necessary to diminish the number of isolation barrier required and ultimately the system cost. This is why a 2-wire interface is provided, with only CLOCK and DATA on the pins SCK/MCLK and SDO respectively. The clock is provided externally by the MCU in this mode in order to be able to synchronize with the MCU. The crystal oscillator is never enabled in the 2-wire mode. The CLOCK pin (SCK/MCLK) serves two purposes: to provide the MCLK continuously to both or a single ADCs depending on the implementation, and provide the serial clock for the output data. The clock on SCK/MCLK must run continuously at a fixed frequency for proper operation. In this mode both SCK and MCLK are equal and synchronous, which also helps to reduce distortion. The interface in this mode has no serial input. It just has a serial output that is always driving the SDO pin. SDO is never in high impedance in this mode. At each internal data ready (which happens at a DRCLK rate), the data is clocked out on SDO in a predefined frame. The frame contains 64 bits and is repeated 4 times for each data ready. In between the last bit of the last frame and the first bit of the first frame for the following data ready, the SDO is maintained at logic LOW since the digital isolators usually consume less current in a logic low input state. Each frame contains 2 identification and synchronization bytes followed by the ADC data of channel0 first (24 bits) and channel1 last (24 bits). The 16 bit ADC width can be disabled in this mode. The 4 frames are also provided at the first clock period (here the ADCs outputs are in default (0x000000h state), which acts as a confirmation of the start convert and help further for synchronization. Additionally, in order to provide more flexibility, five of the digital pins (OSC1, RESET, CS, DR, SDI) have been remapped to become digital input pins and can now control a few settings of the part with simple logic states applied to these pins (See section 10.2). These pins need to have well defined logic states for low power applications. The MDAT0/1 pins may be enabled all the time in this 2-wire interface mode, so that further applications that need bitstream outputs and isolation barriers can be realized easily with the same chip. If not used, these pins need to be left floating. In a typical power metering 3-phase shunt application, the CH0 is meant to be used as the current channel since the gain may only be controlled on the channel 0 (up to 32x as required by low shunt value applications) according to an embodiment. For further security between all channels, isolators can be used with separate chip select signals CS for each pin. This permits to mask the clock during one or more periods in case one of the parts is out of sync or has not received properly all of the clock edges provided by the MCU.

Figure 9:
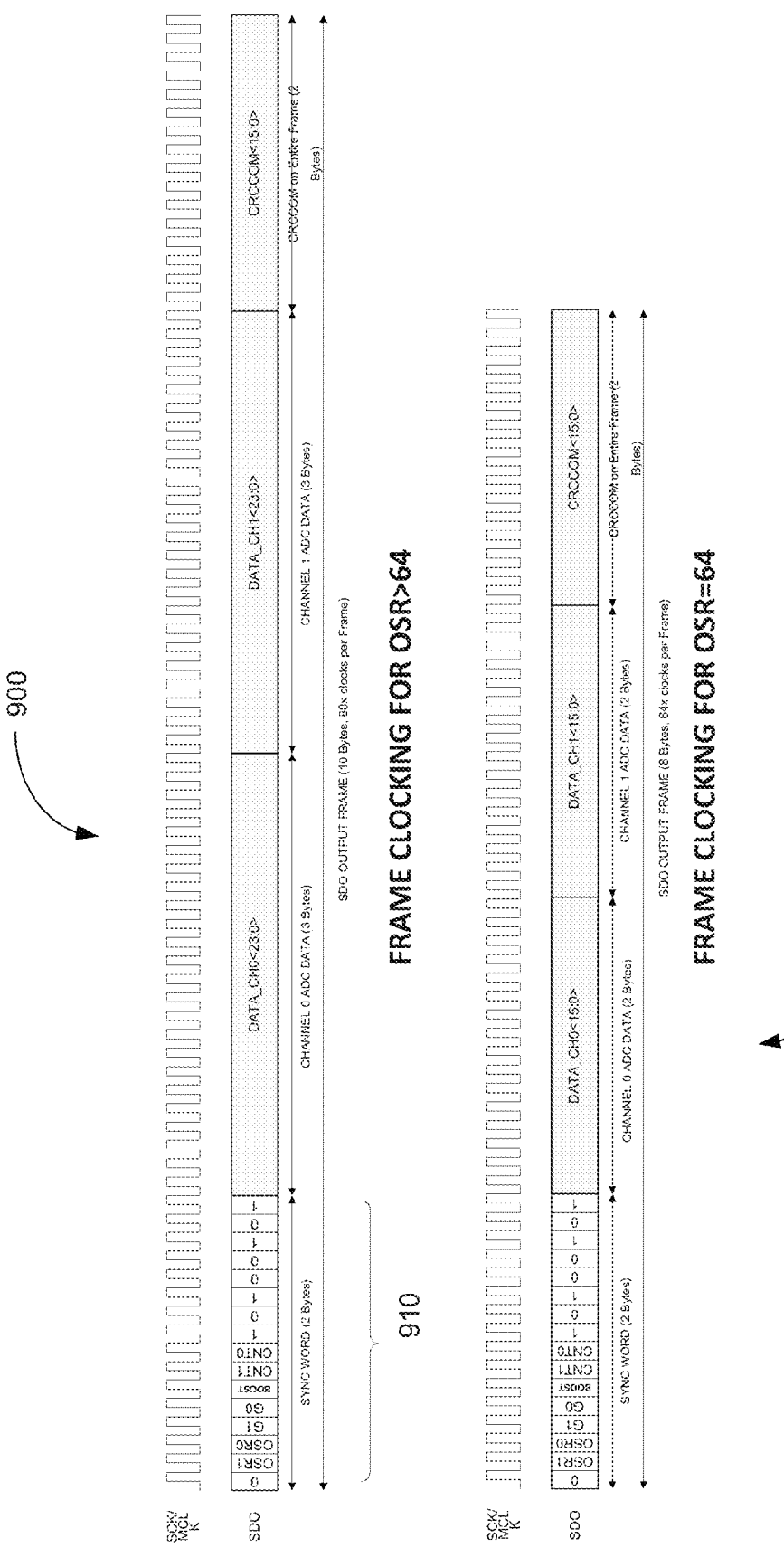
FIG. 9 shows a possible frame structures.

FIG. 9 shows possible frame structures 900 and 950 depending on the oversampling rate. A framed data set may be repeated 4 times between each data ready. This allows for a single SDI pin on the MCU to be used to gather data from up to 4 analog front end devices, for 3-phase meters also requiring neutral measurement provided that each isolator has a chip select or chip enable pin and that each chip select is driven correctly by the MCU. Each of the frames may incorporate a frame count to be recognized from another one according to an embodiment. The frame may also contain a checksum and/or CRC checksum at the end of the frame so that integrity of the data transmission can be verified and guaranteed according to yet another embodiment.

The framed data consists of a 16-bit frame register 910, followed by two 24-bits of channel data, channel 0 first, followed by channel 1. The frame register according to this embodiments is 2 bytes long, the first byte containing the OSR, PGA, and BOOST settings. This first byte further contains 2 bits to give the information about which frame the user is clocking out (out of the 4 repeated frames). This can be used to extract the information about which chip is currently read in a system with one SDI and isolators with chip selects. The second byte of the frame register 1410 can be a simple 0xA5 code to further give confidence when attempting to synchronize communication with a microcontroller.

Figure 10:
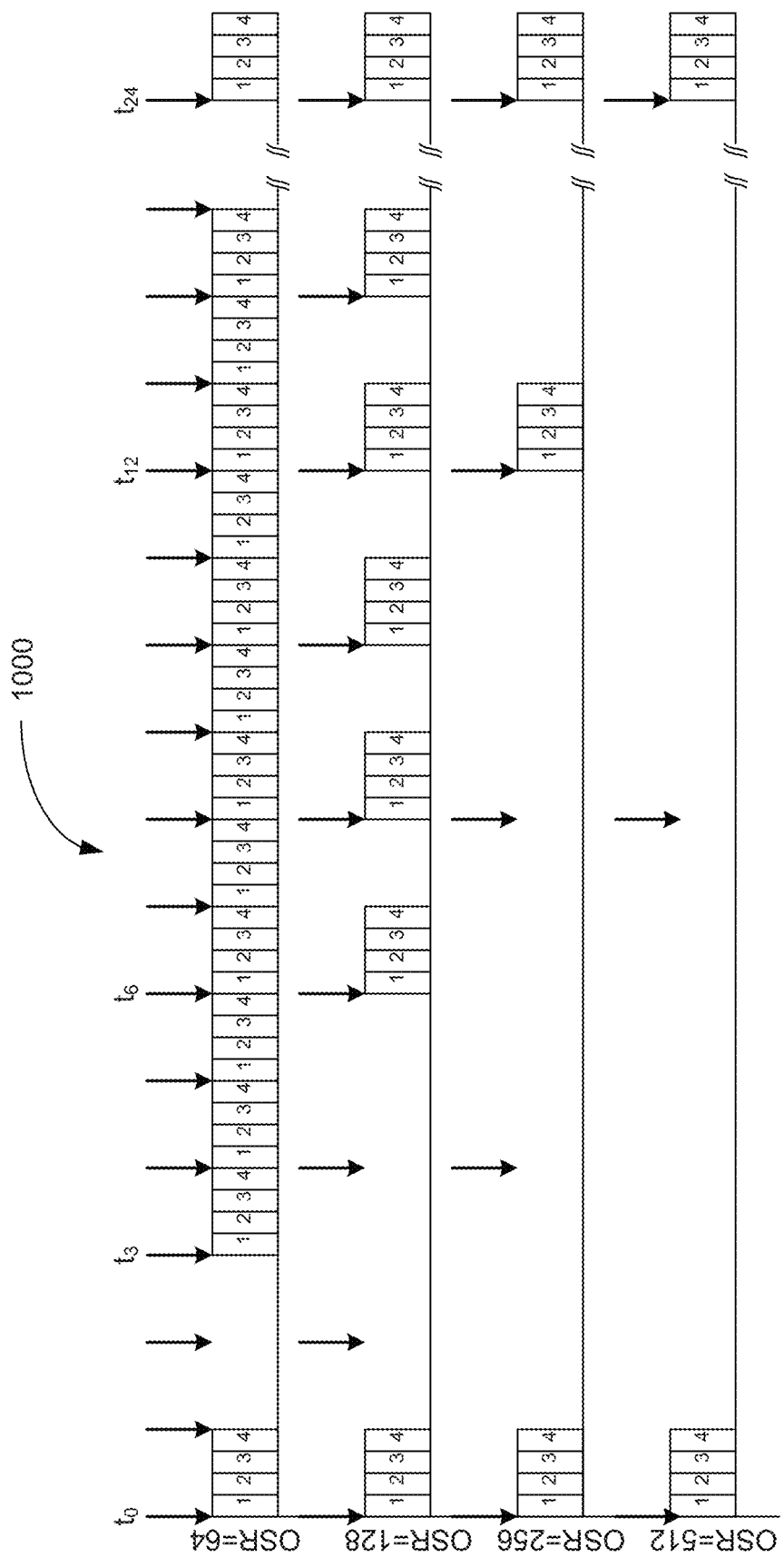
FIGS. 10 and 11 shows a data output timing diagrams according to various embodiments.
Figure 11:
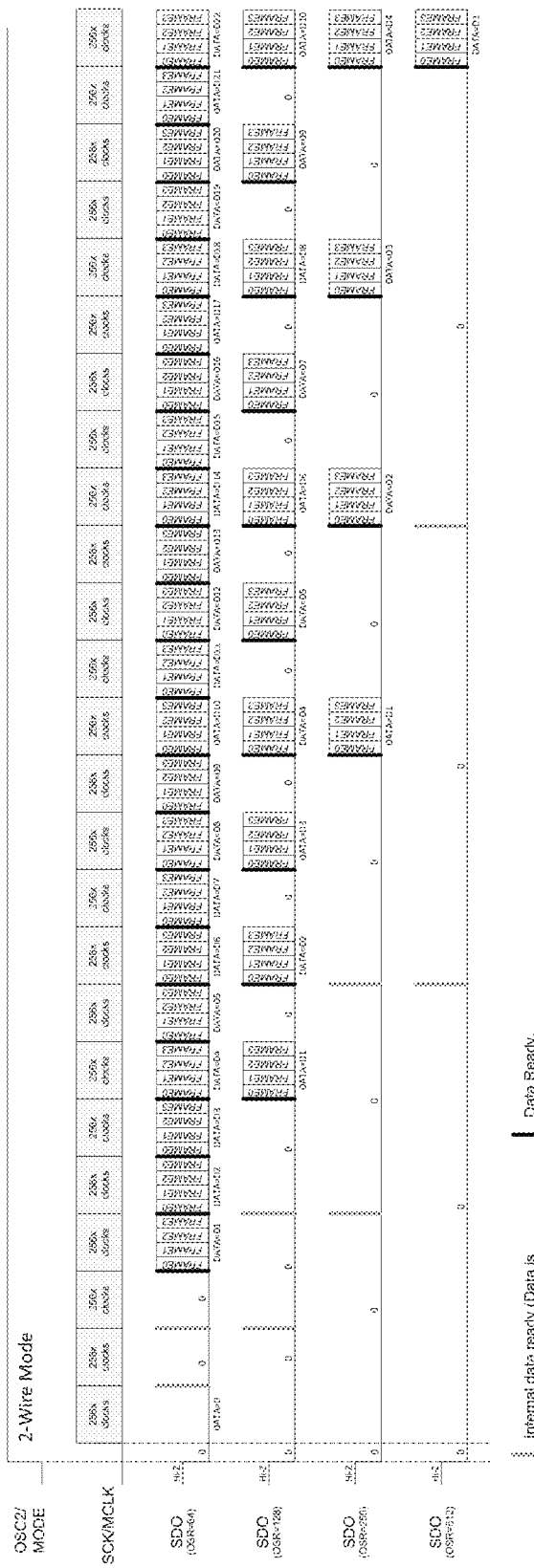

FIG. 10 shows a data output timing diagram 1000 in relation to the oversampling setting through pins OSR0 and OSR1. According to this embodiment, four different settings can be made through pins OSR0 and OSR1, for example OSR=64, OSR=128, OSR=256 and OSR=512. Here the frame is repeated four times per data ready (one data ready per OSR) to enable up to 4-phase multiplexed data applications using 1 output pin. FRM0/1/2/3 is the same for each data ready, only the two counter bits (cnt0/1) are varying to report the frame count. As can be seen, the analog front end device outputs a first frame in which the data for the channels is set to zero indicating a reset condition wherein a reset is assumed to occur at time $t_0$. Then, for the next two data ready events a settling time applies during which no new data is available yet and therefore no frame output occurs. At time t3, the device is fully operational and can output frames continuously, wherein depending on the oversampling respective time gaps between the may occur as shown in FIG. 10 due to the fact that toe output data is always transmitted with the same speed independent of the oversampling rate. FIG. 11 shows a timing diagram according to yet another embodiment. Here, the no initial "zero" frame is output. Rather the SDO line goes from a high impedance to a logic "0" indicating the start. FIG. 11 also shows a possible clock relationship and the mode selection signal.

What is claimed:

1. An analog front end (AFE) device comprising:
   at least one programmable analog-to-digital converter (ADC);
   a serial interface switchable to operate in a bidirectional serial interface mode and in a unidirectional two wire serial interface mode, wherein the unidirectional two wire serial interface mode only uses a clock input and a data output signal line, wherein the ADC operates in the unidirectional two wire serial interface mode synchronous with a clock supplied to the clock input.

2. The AFE device according to claim 1, wherein when the serial interface is configured in the unidirectional two wire serial interface mode a data output at the data output signal line is frame based.

3. The AFE device according to claim 2, wherein a frame comprises a frame register value and frame data and wherein a frame is transmitted through said serial interface after a data ready signal is generated by said ADC.

4. The AFE device according to claim 3, wherein the frame comprises parameter settings of said AFE device.

5. The AFE device according to claim 3, wherein the frame is repeated n times between consecutive data ready signals.

6. The AFE device according to claim 5, wherein each of the frames incorporates a frame count to be recognized from another one.

7. The AFE device according to claim 2, wherein the frame contains checksum and/or CRC checksum so that integrity of the data transmission can be verified and guaranteed.

8. The AFE device according to claim 7, wherein the checksum and/or CRC checksum is placed at the end of the frame.

9. The AFE device according to claim 1, wherein the ADC comprises at least one of internal voltage reference, internal clock generation, and internal gain amplifier.

10. The AFE device according to claim 1, further comprising a PLL for generating an internal clock signal which is faster than a clock signal provided on said two-wire serial interface.

11. The AFE device according to claim 1, wherein the programmable ADC is a sigma-delta converter driven by the clock signal provided by the two-wire serial interface.

12. The AFE device according to claim 1, wherein the AFE device is designed to automatically reset when a clock signal at said clock input is kept for a certain time at a defined logic level or floating.

13. The AFE device according to claim 1, wherein the AFE is arranged within a housing comprising external pins and wherein some of the external pins are configured to program the operating mode and the ADC by respective signals applied to some of the external pins.

14. The AFE device according to claim 13, wherein the signals are selected from a power supply and ground or any other fixed DC voltage level, or by a floating node detector.

15. The AFE device according to claim 13, wherein an oversampling rate can be programmed by at least one of said external pins.

16. The AFE device according to claim 13, wherein a pin is provided for programming the operating mode of said serial interface.

17. The AFE device according to claim 13, wherein a gain can be programmed by at least one of said pins.

18. The AFE device according to claim 3, wherein two pins are provided for programming the gain.

19. The AFE device according to claim 1, wherein the AFE device comprises a plurality of multiple function pins and one external pin is configured to set an operation mode of the device, wherein in a first mode, the device operates with the two-wire serial interface and uses external pins for programming said AFE device and in a second mode the device operates with a standard input/output serial digital interface for programming said AFE device.

20. The AFE device according to claim 1, wherein in an initialization phase the AFE device uses a 1-wire protocol or a UART interface to program the part and then the part returns automatically into the 2-wire mode.

21. A system comprising a plurality of AFE devices according to claim 1 and further comprising:
    a microcontroller unit,
    digital isolation device for each AFE, wherein a digital isolation device includes one set of bidirectional digital isolation units for transmitting a data signal from the AFE and receiving a clock signal from the microcontroller unit, wherein the microcontroller comprises separate serial inputs for each AFE.

22. The system according to claim 21, wherein a single clock output of the microcontroller is coupled through said digital isolation devices with each AFE.

23. The system according to claim 21, wherein the microcontroller comprises dedicated clock outputs for each AFE.

24. The system according to claim 21, wherein each digital isolation device comprises a chip select input on a microcontroller connected side of the digital isolation device, wherein the chip select inputs are coupled with respective port outputs of the microcontroller.

25. A method of operating an analog front end (AFE) device comprising an analog-to-digital converter and serial interface switchable between a first and a second operating mode, the method comprising:
    Selecting said first or said second operating mode by means of an external pin, wherein in said first operating mode, the serial interface operates in a bidirectional serial interface mode and in said second operating mode in a unidirectional two wire serial interface mode, wherein the unidirectional two wire serial interface mode only uses a clock input and a data output signal line;
    Programming the analog-to-digital converter (ADC) by means of external pins; and
    Transmitting digital values acquired by the ADC through the serial interface, wherein when said second operating mode is selected, the ADC operates synchronous with a clock supplied to the clock input.

26. The method according to claim 25, further comprising when said second operating mode is selected, outputting frame based data at the data output signal line.

27. The method according to claim 26, wherein a frame comprises a frame register value followed by said ADC digital values.

28. The method according to claim 27, wherein the frame comprises parameter settings of said AFE device.

29. The method according to claim 26, wherein a number of frames are output during consecutive data ready signals of the ADC.

30. The method according to claim 25, wherein the AFE device comprises a gain amplifier and the method further comprises programming the gain amplifier by means of external pins when said second operating mode is selected.

31. A method for operating an analog front end device in a first and second operating mode, wherein the analog front end device comprises a programmable analog-to-digital converter (ADC); a programmable gain amplifier, and a serial interface arranged in a housing with a plurality of multi-function pins, the method comprising:
- providing one external pin to select the first or second operating mode;
- wherein in the first operating mode, the multi-function pins are controlled to provide a bidirectional serial interface for said AFE device, and
- wherein in the second operating mode, the multi-function pins are controlled to provide a reduced pin unidirectional serial interface and programmability of the AFE device through at least one of said multi-function pin.

32. The method according to claim 31, wherein when in said second mode, said serial interface operates as unidirectional serial interface which receives a clock signal and outputs a frame comprising a frame register value followed by digital values acquired by the ADC, and wherein the received clock signal is used to operate said ADC.

33. The method according to claim 32, wherein a number of frames are output during consecutive data ready signals of the ADC.

34. The method according to claim 32, wherein the frame comprises parameter settings of said AFE device.

* * * * *